United States Patent [19]

Kobayashi

[11] Patent Number: 5,506,826
[45] Date of Patent: Apr. 9, 1996

[54] LIFE SPAN DETECTOR FOR A LASER DIODE AND A COMPACT DISK PLAYER HAVING THE SAME

[75] Inventor: Teruyuki Kobayashi, Ueda, Japan

[73] Assignee: Shinano Kenshi Kabushiki Kaisha, Nagano, Japan

[21] Appl. No.: 338,820

[22] Filed: Nov. 10, 1994

Related U.S. Application Data

[63] Continuation of Ser. No. 36,267, Mar. 24, 1993, abandoned.

[30] Foreign Application Priority Data

Jan. 19, 1993 [JP] Japan ................................ 5-024870
Jan. 21, 1993 [JP] Japan ................................ 5-026283

[51] Int. Cl.$^6$ ............................................ G11B 7/00
[52] U.S. Cl. ........................................ 369/54; 369/116
[58] Field of Search ........................ 369/116, 54, 58, 369/53, 47, 48, 50

[56] References Cited

U.S. PATENT DOCUMENTS

| | | | |
|---|---|---|---|
| 4,685,097 | 8/1987 | van der Put | 369/116 |
| 4,747,091 | 5/1988 | Doi | 369/116 |
| 5,019,769 | 5/1991 | Levinson | 372/31 |
| 5,172,365 | 12/1992 | Call et al. | 369/116 |

*Primary Examiner*—Georgia Y. Epps
*Assistant Examiner*—P. W. Huber

[57] ABSTRACT

In a life span detector of the present invention, a current detecting circuit detects current intensity through a laser diode. The current detecting circuits is provided between an electric source and the laser diode. A comparing circuit compares the current intensity detected with a predetermined value. The comparing circuit outputs a predetermined signal when the current intensity detected is greater than the predetermined value. In a compact disc player of the present invention, an optical pick-up includes a laser diode, and a life span detector which detects a life span of the laser diode. By the life span detector, the life span of the laser diode can be timely known. Thus, the occurrence of sound skip and missing data which result from a deteriorated laser diode can be prevented.

15 Claims, 5 Drawing Sheets

FIG.6
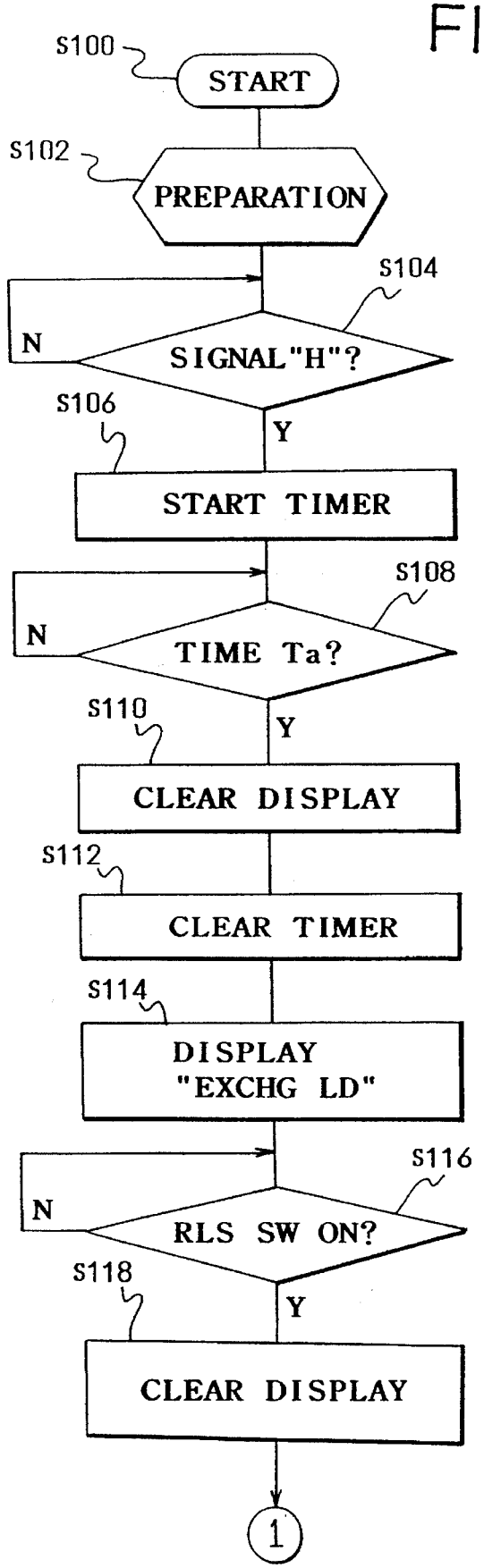
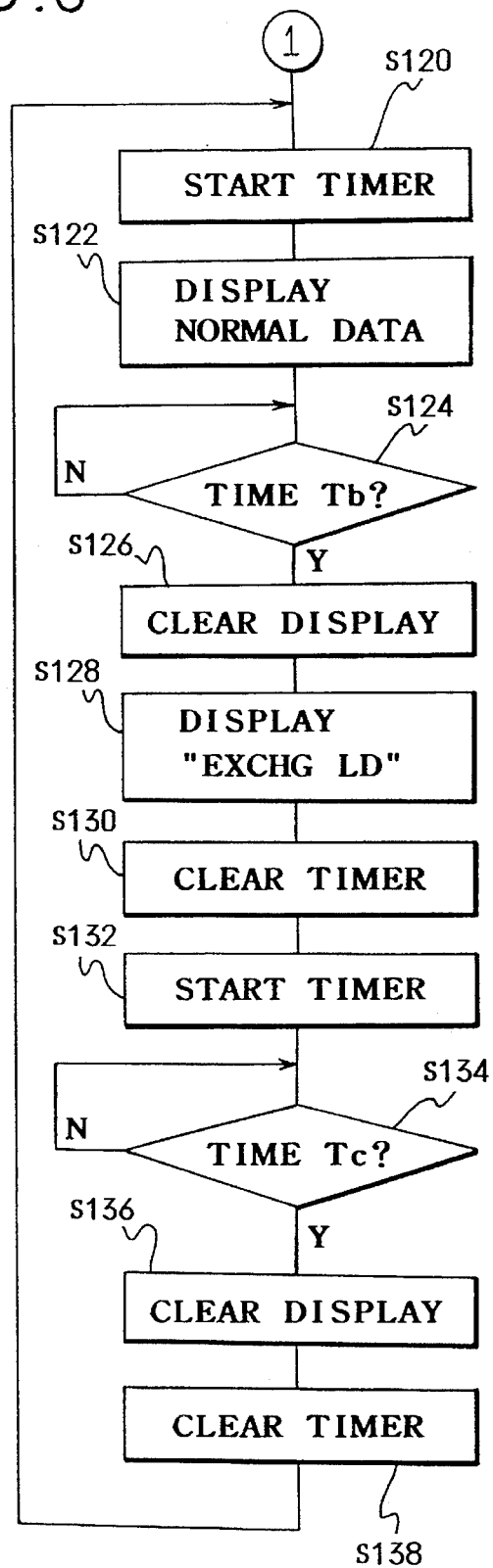

LIFE SPAN DETECTOR FOR A LASER DIODE AND A COMPACT DISK PLAYER HAVING THE SAME

This application is a continuation, of patent application Ser. No. 08/036,267 filed on Mar. 24, 1993, now abandoned.

BACKGROUND OF THE INVENTION

The present invention relates to a life span detector for a laser diode.

The present invention also relates to a compact disc player (including a laser disc player, a CD-ROM player, and a CD-I player), which has an optical pick-up including the laser diode.

Conventionally, an optical pick-up of a compact disc player includes a laser diode for emitting a laser beam in order to read data, which is recorded on a disc. When electric current passes through the laser diode, the laser diode emits the laser beam. In the case of using the compact disc player for a long time, the laser diode gradually deteriorates and its luminous intensity lowers. Therefore, a laser diode driver circuit for emitting the laser diode is capable of detecting the luminous intensity thereof and raising electric current intensity when the luminous intensity lowers in order to maintain predetermined luminous intensity. If the laser diode further deteriorates (e.g., 5,000 hours or more), it is impossible to maintain the prescribed luminous intensity. In this case, the optical pick-up cannot accurately read data recorded, and sound skip occurs. Finally, the laser diode, whose life span is completed, must be changed because the data recorded cannot be read by the optical pick-up.

However, the conventional compact disc player has no life span detector for a laser diode, so the life span of the laser diode cannot be known until the sound skip has occurred or the data are unable to be read. Thus, in case of completing the life span while important data are read or music is played back, there is possibility of missing the important data or music.

SUMMARY OF THE INVENTION

An object of the present invention is to provide a life span detector for a laser diode, which is capable of timely detecting the life span thereof.

Another object of the present invention is to provide a compact disc player, which has said life span detector.

To achieve above described objects, firstly the life span detector comprises: current detecting means for detecting intensity of current, which passes through the laser diode, the current detecting means being connected between an electric source and the laser diode; and comparing means for comparing the current intensity detected by the current detecting means with a predetermined value, the comparing means outputting a predetermined signal when the current intensity is greater than the predetermined value.

Secondly the compact disc player, which has an optical pick-up including a laser diode, comprises a life span detector for detecting a life span of the laser diode. The life span detector may be a circuit having the current detecting means and the comparing means.

The life span detector has the current detecting means and the comparing means, so the current intensity through the laser diode can be detected by the current detecting means. If the laser diode deteriorates, the current intensity through the laser diode rises. When the current intensity is greater than the predetermined value, the comparing means outputs the predetermined signal. Thus, the life span of the laser diode can be timely known by detecting the signals.

By assembling the life span detector in a compact disc player, the life span of the laser diode can be timely known, so that occurring of the sound skip and the data missing can be prevented.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

An embodiment of the present invention will now be described by way of examples and with reference to the accompanying drawings, in which:

FIG. 6 is a flowchart showing the steps of detecting the life span of a laser diode.

DETAILED DESCRIPTION OF A PREFERRED EMBODIMENT

A preferred embodiment of the present invention will now be described with reference to the accompanying drawings.

Firstly, a structure will be explained.

Figure 1:
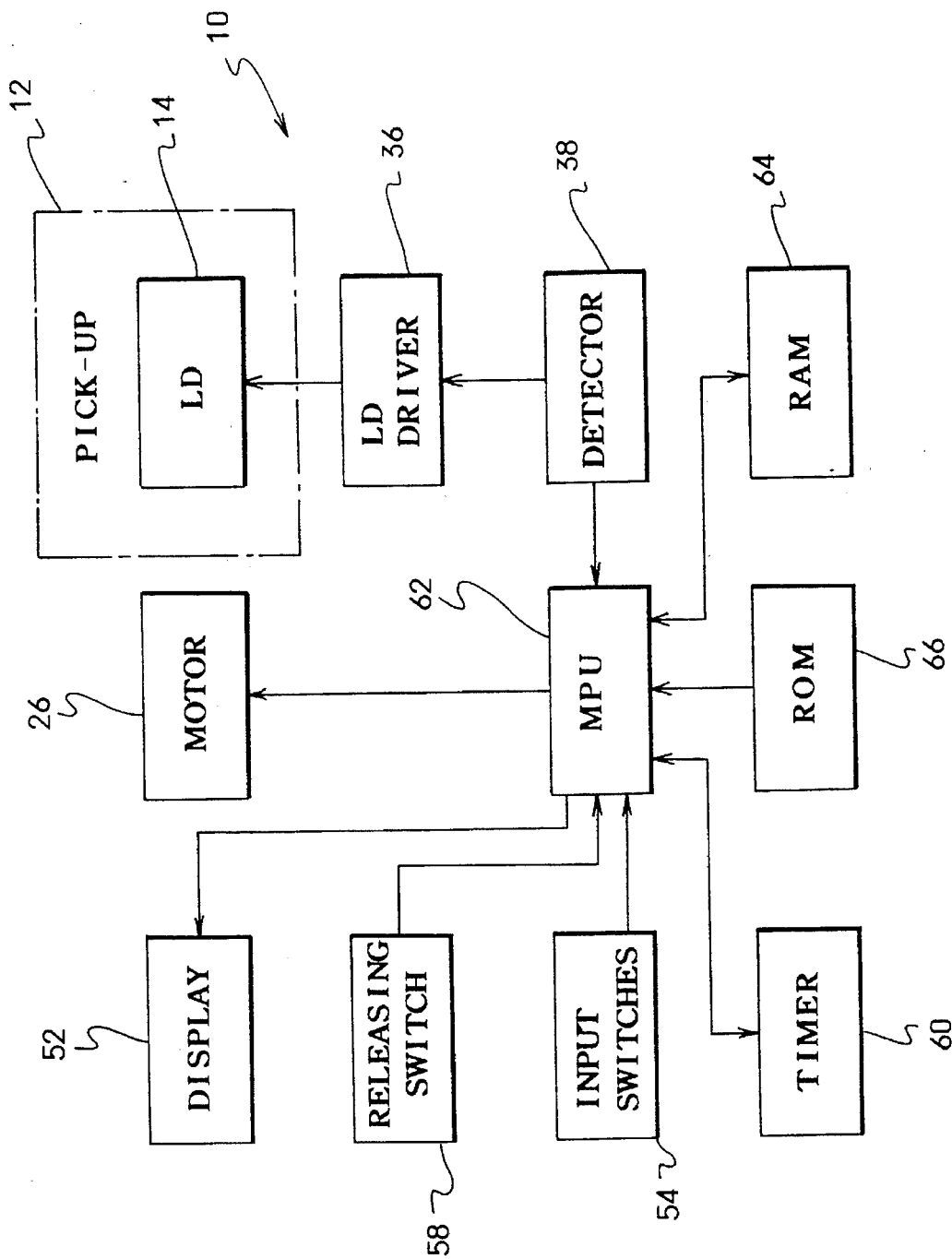
FIG. 1 is a block diagram of a compact disc player of the embodiment.

FIG. 1 is a block diagram of a compact disc player 10 of the present embodiment.

Figure 2:
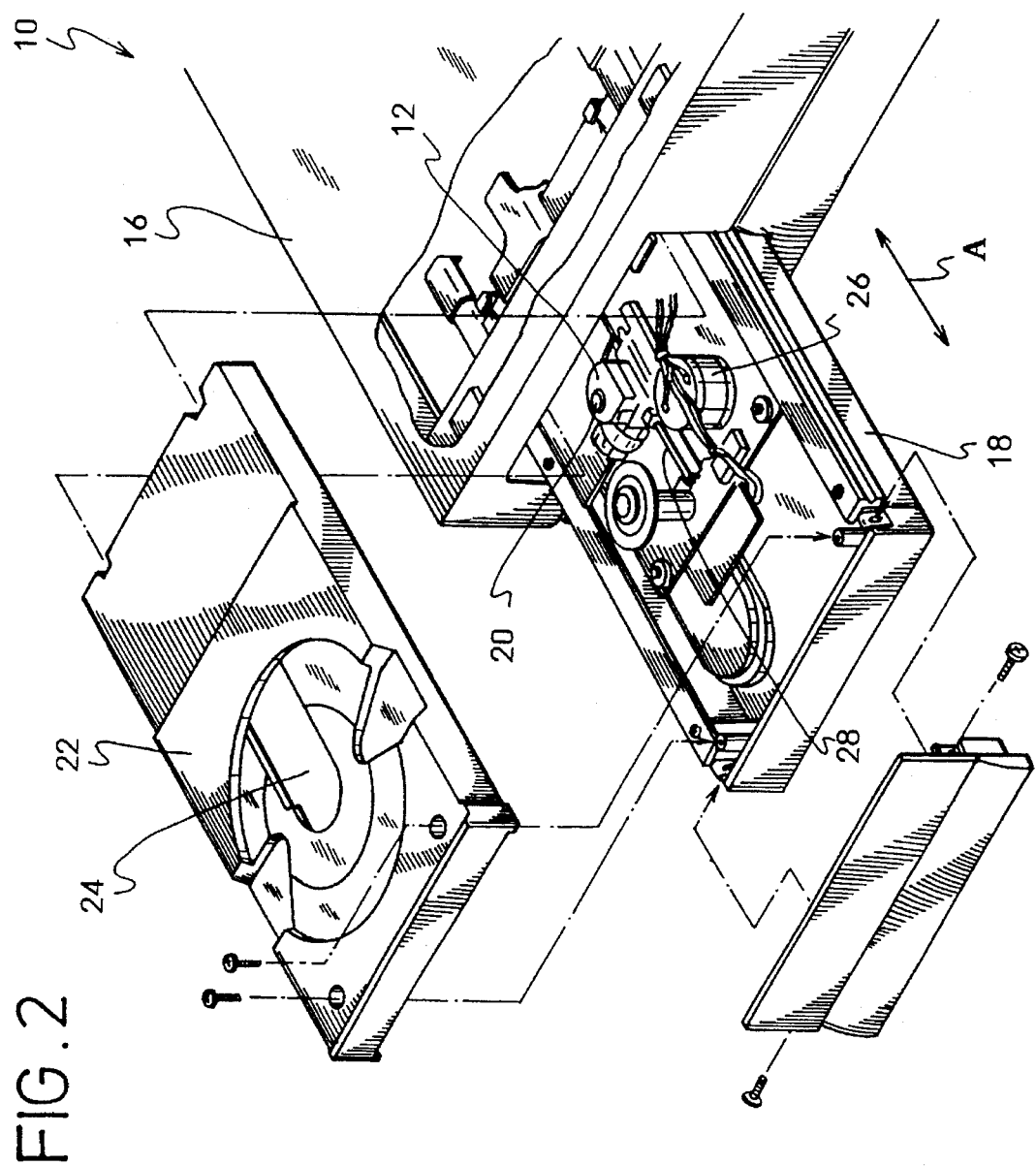
FIG. 2 is a partial exploded perspective view of a main part of the compact disc player.

In FIG. 1, an optical pick-up 12 is capable of reading data, which are recorded on a disc (not shown). There is assembled a laser diode 14, which is capable of emitting a laser beam, in the pick-up 12. As clearly shown in FIG. 2, the pickup 12 is provided in a disc tray 18, which is capable of drawing out from and retracting into a housing 16 of the compact disc player 10. There is provided a lens 20 on an upper face of the pick-up 12 so as to emit a laser beam, which is emitted from a laser diode 14, upward. The location of the pick-up 12 corresponds to an opening section 24 of a tray case 22, which is capable of covering over the disc tray 18 and accommodating the disc in an upper section. The pick-up 12 is capable of reciprocatively moving in the direction A. The pick-up 12 is driven by a motor 26. The driving mechanism of the pick-up 12 is shown in FIG. 3.

Figure 3:
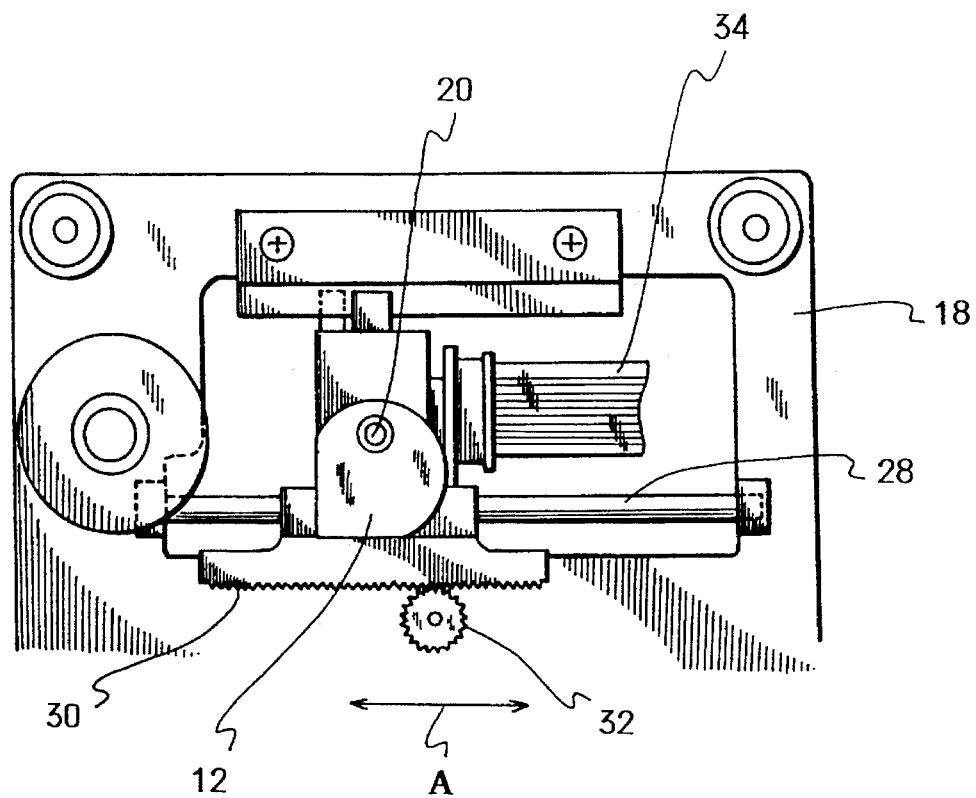
FIG. 3 is a partial plan view in the vicinity of an optical pick-up thereof.

In FIG. 3, both ends of a guide bar 28 are fixed to the disc tray 18. The guide bar 28 is pierced through the pick-up 12, so that the pick-up 12 is capable of moving along the guide bar 28 in the direction A. There is fixed a rack 30 on a side face of the pick-up 12. The rack 30 is engaged with a pinion 32, which is rotatably provided in the disc tray 18. The pinion 32 is rotated by the motor 26. The movement of the pick-up 12 in the direction A is controlled by controlling the rotational direction and the amount of rotation of the motor 26. Note that, the pick-up 12 is electrically connected to other parts by a flexible printed circuit 34.

In FIG. 1, a laser diode driver 36 applies electric current from an electric source (e.g., source voltage Vcc= DC+5 V) to the laser diode 14. The laser diode driver 36 is capable of detecting the luminous intensity of the laser diode 14. And the laser diode driver 36 raises the current intensity through the laser diode 14 so as to maintain the luminous intensity when the luminous intensity detected is lower than a predetermined value.

A life span detector 38 is provided in the disc tray 18. The life span detector 38 detects the current intensity through the laser diode 14, and outputs predetermined detecting signals showing the completion of the life span of the laser diode 14 when the current intensity detected is greater than the predetermined value. A circuit diagram of the life span detector 38 is shown in FIG 5.

Figure 5:
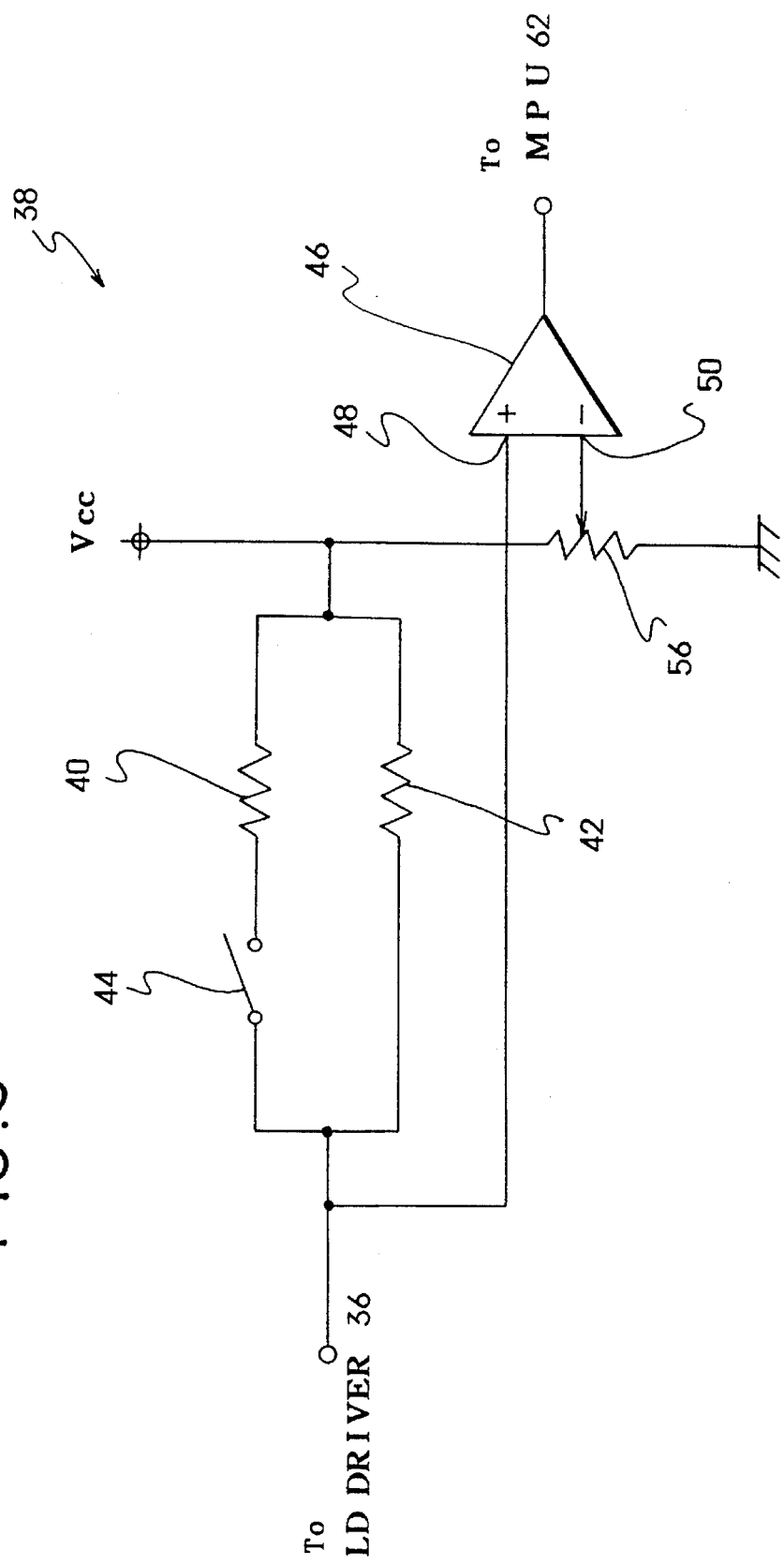
FIG. 5 is a circuit diagram of a life span detector assembled in the compact disc player.

In FIG. 5, the life span detector 38 is connected to the electric source Vcc and the laser diode driver 36. A resistance 40, which is an example of current detecting means, is serially connected to the electric source Vcc and the laser diode driver 26. The resistance 40 is capable of converting the current intensity through the laser diode 14 to voltage. Thus, the current intensity through the laser diode 14 can be known detecting the voltage therethrough.

A resistance 42 is connected in parallel to the resistance 40. So as to reduce the resistance value between the electric source Vcc and the laser diode driver 36, the resistance 42 is connected in parallel thereto.

An open-close switch 44 is connected between the resistance 40 and the laser diode driver 36 so as to open and close the circuit therebetween. Thus, when the switch 44 is opened (see FIG. 5), the resistance 40 is not included in the closed circuit, so the resistance value between the electric source Vcc and the laser diode driver 36 is high. On the other hand, when the switch 44 is closed, the resistance 40 is included in the closed circuit, so the resistance value between the electric source Vcc and the laser diode driver 36 is low.

A comparator 46 is an example of comparing means. When the switch 44 is opened, the voltage through the resistance 40 is applied to a plus terminal 48 of the comparator 46; standard voltage is applied to a minus terminal 50 thereof. If the voltage applied to the plus terminal 48 is higher than that applied to the minus terminal 50, the comparator outputs high signals H. On the other hand, if the voltage applied to the plus terminal 48 is lower than that applied to the minus terminal 50, the comparator outputs low signals L The standard voltage applied to the minus terminal 50 of the comparator 46 is the voltage through a variable resistance 56, which is an example of adjusting means. By using the variable resistance 56, the standard voltage can be adjusted, and the initial luminous intensity of the laser diode 14 can be adjusted to the predetermined value. Current intensity for having the predetermined luminous intensity is individually selected for each laser diode 14, e.g., 40–60 mA. Therefore, the standard voltage is also individually selected for each laser diode 14.

Next, the function of the life span detector 38 will be explained.

For the initial set, the switch 44 is opened to make the resistance value between the electric source Vcc and the laser diode driver 36 high. Therefore, the voltage through the resistance 40, which is applied to the plus terminal 48 of the comparator 46, is high. Then the variable resistance 56 is adjusted to make the comparator 46 output the signal H. When the comparator 46 outputs the signal H, the initial set is completed.

Successively, the switch 44 is closed to make the resistance value between the electric source Vcc and the laser diode driver 36 low. Then the voltage through the resistance 40, which is applied to the plus terminal 48 of the comparator 46, is low and the comparator 46 outputs the signal L. Note that, initially, the standard voltage, which is the voltage through the variable resistance 56, is predetermined value, e.g., 10%, higher than the voltage through the resistance 40 in the state of closing the switch 44. Namely, the standard voltage applied to the minus terminal 50 of the comparator 46 is 10%, for example, higher than the initial voltage through the resistance 40.

After the lapse of a long time operation of the compact disc player 10, the laser diode gradually deteriorates, and its luminous intensity becomes lower. If the luminous intensity of the laser diode 14 is lower than the predetermined value, the laser diode driver 36 makes the current intensity through the laser diode 14 rise. By raising the current intensity, the voltage through the resistance 40 becomes greater, and the luminous intensity of the laser diode 14 rises.

Nearly completing the life span of the laser diode 14, the current intensity therethrough is further raised, so that the voltage through the resistance 40 gets greater than the standard voltage, which is 10% greater than the initial voltage therethrough. Thus, when the voltage applied to the plus terminal 48 of the comparator 46 is greater than the standard voltage applied to the minus terminal 50 thereof, the comparator 46 outputs the signal H. Namely the signal H is a detecting signal H, which stands for completing the life span of the laser diode 14.

In FIG. 1, a display unit 52, which is an example of indicating means, shows characters "CHG LD (change the laser diode)" to indicate to an operator, when the life span detector 38 detects completion of the life span of the laser diode 14. The display unit 52 is provided on a front face of the housing 16 (see FIG. 4). Besides the display unit 52, LEDs, buzzers, etc. may be used as the indicating means. The display unit 52 is also capable of showing identifications of data accessing, etc.

Figure 4:
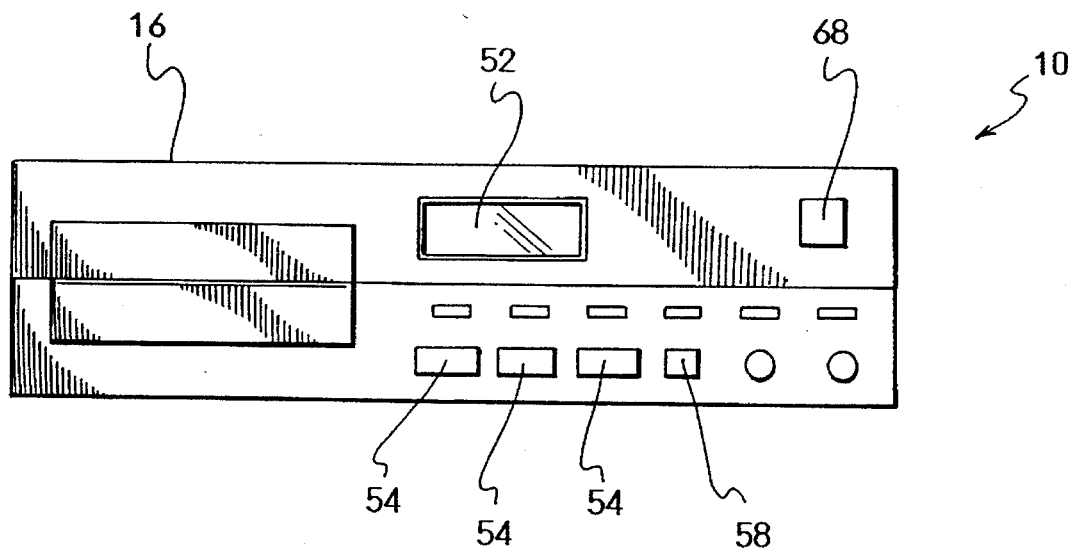
FIG. 4 is a front view of the compact disc player.

Input switches 54 are provided on the front face of the housing 16 (see FIG. 4). Commands and data to the compact disc player 10 are inputted by the input switches 54.

A releasing switch 58, which is an example of releasing means, is provided on the front face of the housing 16 (see FIG. 4). By pushing the releasing switch 58, the characters "CHG LD", which are shown on a screen of the display unit 52 when the life span detector 38 detects completion of the life span of the laser diode 14, temporarily disappear.

A timer 60 measures various time length. The timer 60 may be not only an independent device but also a computer processed software timer.

A microprocessor (MPU) is an example of controlling means. As the controlling means, the MPU 62 shows the characters "CHG LD" on the screen of the display unit 52 when the MPU 62 has received the detecting signal H from the life span detector 38. Besides the function of the controlling means, the MPU 62 controls the whole system of the compact disc player 10 on the basis of control programs.

A RAM 64 temporarily stores inputted data from the input switches 54 and the releasing switch 58, data processed by the MPU 62, and data to be shown by the display unit 52.

A ROM 66 stores an operating system of the MPU 62, and control programs and data for the compact disc players 10.

Successively, the steps of detecting the life span of the laser diode 14 will be explained with further reference to FIG. 6.

Upon turning a main switch 68 on (STEP 100), the MPU 62 reads the control programs out and clears the display 52, the RAM 64 and the timer 60 (STEP 102).

The MPU 62 always checks if the life span detector 38 sends the detecting signal H or not (STEP 104). When the MPU 62 receives the detecting signal H, the MPU 62 makes the timer 60 start (STEP 106).

When the timer 60 checks expiring predetermined time Ta (STEP 108), in other words if the detecting signals H are continuously sent for the time Ta, the MPU 62 clears identifications of data accessing from the screen of the display unit 52 (STEP 110) and clears the timer 60 (STEP 112).

Next, the MPU 62 shows the characters "CHG LD" on the screen of the display unit 52 (STEP 114) and checks if the releasing switch 58 is pushed or not (STEP 116). If the operator pushes the releasing switch 58, the MPU 62 clears the display 52 (STEP 118) and makes the timer 60 restart (STEP 120). Then the MPU 62 resumes the display 52 normal operation and shows data identifications, etc. (STEP 122).

While the display is in normal operation, the MPU 62 checks expiring time Tb by the timer 60 (STEP 124). Upon expiring the time Tb, the MPU 62 clears the display 52 (STEP 126) and reshows the characters "CHG LD" on the screen of the display unit 52 (STEP 128). Then the MPU 62 clears the timer 60 (STEP 130) and restarts again (STEP 132).

Next, the MPU 62 checks expiring time Tc by the timer 60 (STEP 134). Upon expiring the time Tc, the MPU 62 clears the display 52 (STEP 136) and the timer 60 (STEP 138), and returns to the STEP 120. By the above described sequence, the MPU 62 alternately shows the characters "CHG LD" and the data identifications on the screen of the display unit 52 after the releasing switch 58 was pushed.

When the deteriorated laser diode 14 is removed and the new one is assembled, an interruption signal is inputted to the MPU 62, and the MPU 62 returns to the STEP 102 to reset the sequence.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A life span detector for a laser diode, comprising:

an electric source for supplying electric current, which passes through said laser diode to emit light;

current supplying means for supplying the current from said electric source to said laser diode, said current supplying means being connected between said electric source and said laser diode;

current detecting means for directly detecting intensity of the current passing through said laser diode, said current detecting means being connected between said electric source and said current supplying means; and comparing means for comparing the current intensity detected by said current detecting means with a predetermined value, said comparing means outputting a predetermined signal when the current intensity is greater than the predetermined value.

2. The life span detector for a laser diode according to claim 1, wherein said current detecting means is a resistance, which is capable of converting the current intensity to the voltage.

3. The life span detector for a laser diode according to claim 2, wherein said comparing means is a comparator, which compares the voltage converted by said resistance with a standard voltage through a variable resistance which, when varied, adjusts the standard voltage.

4. The life span detector for a laser diode according to claim 3, further comprising adjusting means for adjusting the standard voltage.

5. The life span detector for a laser diode according to claim 1, further comprising indicating means for outputting an indicating signal to indicate completion of a life span of said laser diode when said comparing means outputs said predetermined signal.

6. The life span detector for a laser diode according to claim 5, wherein said indicating means is a display unit, which is capable of showing characters.

7. A compact disc player comprising:

an optical pick-up having a laser diode, a life span detector for detecting a life span of said laser diode, said life span detector includes:

an electric source for supplying electric current, which passes through said laser diode to emit light;

current supplying means for supplying the current from said electric source to said laser diode, said current supplying means being connected between said electric source and said laser diode;

current detecting means for directly detecting intensity of the current passing through said laser diode, said current detecting means being connected between said electric source and said current supplying means; and comparing means for comparing the current intensity detected by said current detecting means with a predetermined value, said comparing means outputting a predetermined signal when the current intensity is greater than the predetermined value.

8. The compact disc player according to claim 7, wherein said current detecting means is a resistance, which is capable of converting the current intensity to the voltage.

9. The compact disc player according to claim 8, wherein said comparing means is a comparator, which compares the voltage converted by said resistance with a standard voltage through a variable resistance which, when varied, adjusts said standard voltage.

10. The compact disc player according to claim 9, further comprising adjusting means for adjusting the standard voltage.

11. The compact disc player according to claim 7, further comprising indicating means for outputting an indicating signal to indicate completion of a life span of said laser diode when said life span detector detects completion of a life span of said laser diode.

12. The compact disc player according to claim 7, further comprising indicating means for outputting an indicating signal to indicate completion of a life span of said laser diode when said comparing means outputs said predetermined signal.

13. The compact disc player according to claim 11, wherein said indicating means is a display unit, which is capable of showing characters.

14. The compact disc player according to claim 12, further comprising control means for controlling said indicating means when said comparing means outputs said predetermined signal.

15. The compact disc player according to claim 12, further comprising releasing means for temporarily releasing the indicating means from outputting said indicating signal.

* * * * *